Figure 3A:
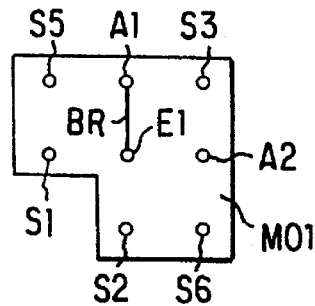

United States Patent [19]
Nicklis

[11] Patent Number: 5,491,406
[45] Date of Patent: Feb. 13, 1996

[54] MEASURING RANGE ADAPTER

[75] Inventor: Rainer Nicklis, Gleisweiler, Germany

[73] Assignee: Siemens Aktiengesellschaft, Müchen, Germany

[21] Appl. No.: 295,889

[22] PCT Filed: Mar. 8, 1993

[86] PCT No.: PCT/DE93/00211

§ 371 Date: Sep. 8, 1994

§ 102(e) Date: Sep. 8, 1994

[87] PCT Pub. No.: WO93/18411

PCT Pub. Date: Sep. 16, 1993

[30] Foreign Application Priority Data

Mar. 11, 1992 [DE] Germany .................. 92 03 297.4

[51] Int. Cl.[6] .......................... G01R 1/04; H01R 29/00; G01D 1/04
[52] U.S. Cl. ................................ 324/115; 439/266
[58] Field of Search ................ 324/115, 123 R, 324/72.5, 149, 72, 158, 159, 160, 161, 162, 163; 439/266, 239

[56] References Cited

FOREIGN PATENT DOCUMENTS 2734841  2/1979  Germany.
2181905  4/1987  United Kingdom.

Primary Examiner—Kenneth A. Wieder
Assistant Examiner—Barry Bowser
Attorney, Agent, or Firm—Kenyon & Kenyon

[57] ABSTRACT

An arrangement has a unit with at least one plug for pluggable module (MO1, MO2) that forwards signals to a processing and/or peripheral unit, so that the measuring range of the unit is adapted to the measuring range of the signals. The disclosed arrangement requires only one further module (MO1, MO2) for all measuring ranges, i.e., for all voltage and current ranges. The desired measuring range is set by the position of the module (MO1, MO2) on the plug. The invention has application in input and output component groups.

22 Claims, 3 Drawing Sheets

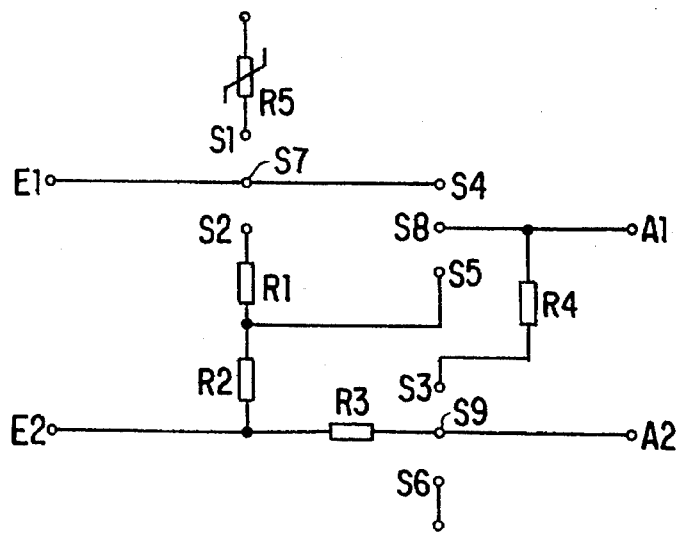
FIG. 1
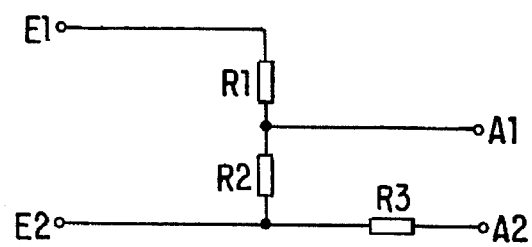
FIG. 2a
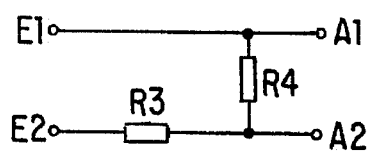
FIG. 2b
FIG. 2c

MEASURING RANGE ADAPTER

The invention relates to a device with a unit comprising at least one plug for a pluggable module that forwards signals to a processing and/or peripheral unit, with adaptation of the measuring range of the unit to the measuring range of the signals being provided.

A device of this kind is known from Siemens Catalog ST 54.1, 1990, Chapter 4, "input/output modules." A signal former, e.g. an analog input module, is provided with four plugs to receive pluggable modules, which adapt the measuring ranges of this signal former to the measuring ranges of process input signals. The signals are digitized in the signal former and forwarded to a processing unit for further processing. Different measuring range modules are provided for different measuring ranges, e.g. ±1 V, ±20 mA, which interferes with planning an automation system. In addition, it is not possible to match the signal former and module to one another, since the module and the signal former are manufactured and tested separately and planning during testing is not known.

The goal of the present invention is to provide a device of the species recited at the outset which simplifies planning of an automation system with regard to the use of signal formers.

This goal is achieved by virtue of the fact that the module is differently pluggable into the plug, by the fact that the plug is provided with a first means that bears an effective relationship with a second means of the module such that a measuring range is set by the position of the plugged-in module.

With the device according to the invention, only one module is required for all measuring ranges, i.e. for all voltage and current ranges. The desired measuring range is adjusted by the position of the module on the plug.

The plug of the signal former has a simple input circuit with a plurality of connectable measuring points which are short circuited by bridges in the module in accordance with the desired measuring range to be set.

In one embodiment of the invention according to features of claim 3, the processing unit detects for example what measuring range has been set and can then distinguish non-noisy signals from noisy signals. It can process signals correctly and recognize signal errors.

The module can be designed so that the necessary bridges for each measuring range are arranged on partial surfaces of a side, for example of a cube. The module can however also be designed in such fashion that each side of a cube has bridges for one measuring range.

Additional advantageous embodiments of the invention will follow from the other subclaims.

The invention will now be described in greater detail together with its embodiments and advantages with reference to an embodiment shown in the drawing.

FIG. 1 shows an input circuit for an analog input;
FIG. 2 shows different measuring range settings with the input circuit according to FIG. 1;
FIGS. 3 and 4 show various module designs;
FIG. 5 shows various types of modules; and
FIG. 6 shows the marks on a plug on an analog input.

In FIG. 1, S1, S2, ... S9 represent connectable measuring points of an input circuit of a plug of an analog input. These measuring points conduct input signals to inputs E1, E2 through resistors R1, R2, ... R5 depending on the bridge settings at these measuring points to outputs A1, A2. Thus for example three circuit versions shown in FIGS. 2a to 2c can be set for three different measuring ranges. A circuit version according to FIG. 2a is produced by virtue of the fact that a connection of measuring point S7 with S8 and bridging of measuring point S9 are produced, a circuit version according to FIG. 2b is produced by connecting measuring point S2 with S7, measuring point S5 with S8, and by bridging measuring point S9. Another circuit version according to FIG. 2c is produced by connecting point S7 with S8 and S3 with S9.

Figure 3B:
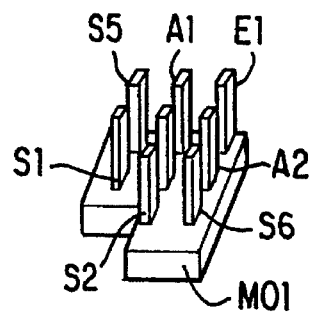

In order to set the three circuit versions shown in FIG. 2 and hence three measuring ranges, bridges BR are combined in FIG. 3 in a module MO1 embedded in plastic, corresponding to these measuring ranges to be set. For the sake of clarity, only one bridge BR is shown in FIG. 3a. In addition, in the present example the connections of measuring points S4, S7, S8, and S9 may be omitted since for the measuring ranges shown, points S4 and S7 correspond to input E1, point S9 corresponds to output A2, and point S8 corresponds to output A1. In FIG. 3a the module is shown as a socket element with corresponding spring contacts, not shown. In FIG. 3 it is shown as an element with pins. Depending on whether the embodiment of the pluggable module is in the form of a socket element or an element with pins, the plug of the input circuit is provided with pins or spring contacts. The three different measuring ranges can now be set by rotating pluggable module MO1, i.e. depending upon the position of the module when plugged into the plug of the input circuit, one of the three possible measuring ranges in FIGS. 2a, 2b, or 2c will be set.

Figure 4A:
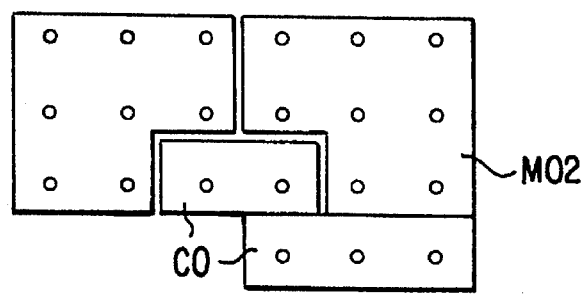
Figure 4B:
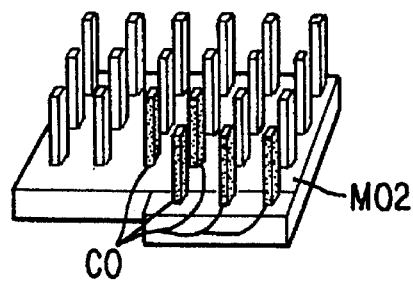

FIGS. 4a and 4b also show a module MO2 designed as a socket element or an element with pins, in a two-channel design provided with coding means CO. These coding means CO, also designed as an element with pins or a socket element, indicate to a processing unit, not shown here, which measuring range is set on the input circuit of the analog input. In the case of an analog output, the coding means CO of a peripheral unit indicate the measuring range set.

Figure 5A:
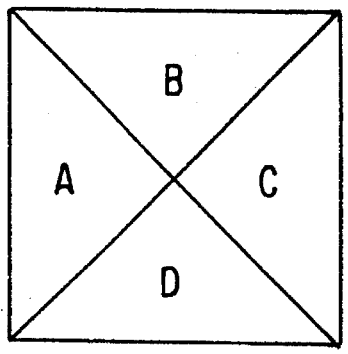
Figure 5C:
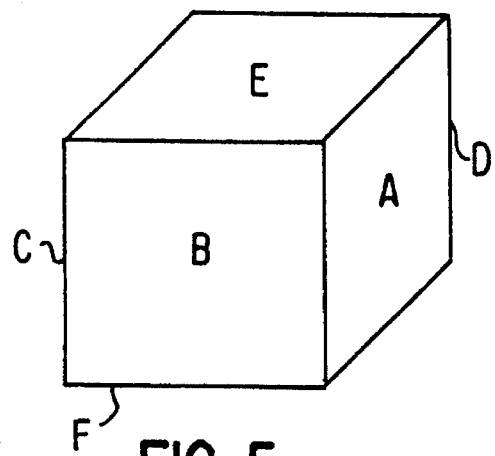
Figure 5B:
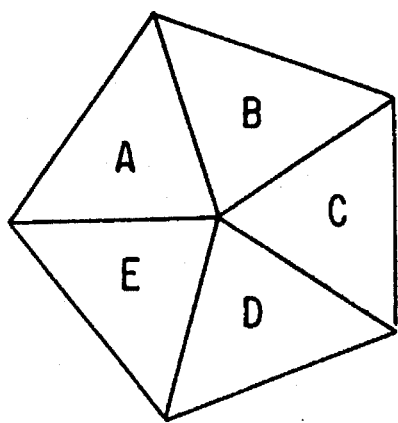
Figure 6:
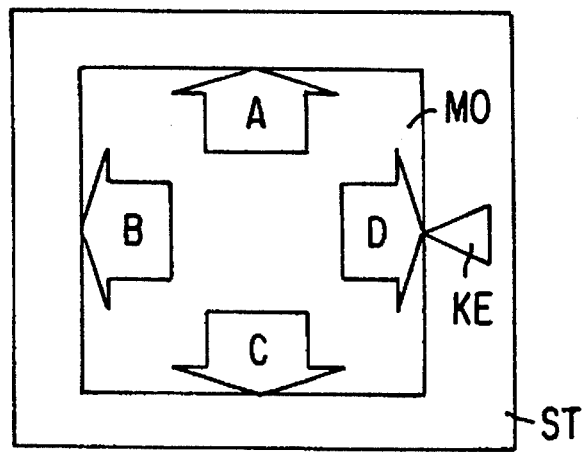

FIG. 5 shows different designs of a module. One side of the module in FIGS. 5a and 5b is subdivided into a plurality of partial surfaces that have bridges for the different measuring ranges to be set. In the design shown in FIG. 5a, four measuring ranges A . . . D can be set corresponding to the five measuring ranges A . . . E shown in FIG. 5b. FIG. 5c shows a cube-shaped structure with each side A . . . F being provided with bridges for measuring range adjustment.

In order to make it possible to set a measuring range simply, the partial or side surfaces of the structure are provided with marks A, B, C, D (FIG. 6) and plug ST of the unit is marked KE in order easily to match the desired measuring range to be set with the position of the module on the plug. In the example shown, mark D on module MO points to the mark KE on plug ST, indicating that the measuring range corresponding to mark D has been set.

I claim:

1. A device for coupling signals to a pluggable module that forwards signals to a processing and/or peripheral unit, said device comprising:
   a) at least one plug for mating with the pluggable module;
   b) means for adjusting a measuring range of the device to a measuring range of the signals being provided;
   c) means for mating the plug with the pluggable module in different ways; and
   d) a first means for cooperating with a second means in said pluggable module such that the position of said plugged-in module when mated with the plug sets the measuring range of the device.

2. The device according to claim 1, wherein the first means comprises an input circuit provided with connectable measuring points, and the second means comprises bridges to couple these measuring points.

3. The device according to claim 1, wherein the device further comprises means for cooperating with means on the module to indicate the measuring range that has been set to the processing and/or peripheral unit.

4. The device according to claim 1, wherein the module has a structure with one side that is subdivided into a plurality of partial surfaces that have bridges.

5. The device according to claim 1, wherein the module has a structure with side surfaces containing a plurality of bridges.

6. The device according to claim 4, wherein each partial surface comprises marks and the plug is marked.

7. The device according to claim 1, wherein the module is embedded in plastic.

8. The device according to claim 1, wherein the module is provided with knife or spring contacts.

9. The device according to claim 1, wherein the plug is provided with knife or spring contacts.

10. The device according to claim 5, wherein the structure is made in the shape of a cube.

11. An automating device with a unit having at least one plug with a pluggable module that forwards signals to a processing unit of the automating device or to a peripheral unit coupled to the automating device, and is pluggable in different ways on the plug for setting different measuring ranges of the unit, said module having coding means that indicate a measuring range setting to the processing or peripheral unit.

12. The automating device according to claim 11, wherein the module is made cube-shaped, with each side being provided for one measuring range setting.

13. An apparatus including:
   a) a pluggable module for forwarding signals to a processing and/or peripheral unit; and
   b) a device for coupling signals to the pluggable module, said device including:
      (i) at least one plug for mating with the pluggable module;
      (ii) means for adjusting a measuring range of the device to a measuring range of the signals being provided;
      (iii) means for mating the plug with the pluggable module in different ways; and
      (iv) a first means for cooperating with a second means in said pluggable module such that the position of said plugged-in module when mated with the plug sets the measuring range of the device.

14. The apparatus according to claim 13, wherein the first means comprises an input circuit provided with connectable measuring points, and the second means comprises bridges to couple these measuring points.

15. The apparatus according to claim 13, wherein the module further comprises means to indicate the measuring range that has been set to the processing and/or peripheral unit.

16. The apparatus according to claim 13, wherein the module has a structure with one side that is subdivided into a plurality of partial surfaces that have bridges.

17. The apparatus according to claim 13, wherein the module has a structure with side surfaces containing a plurality of bridges.

18. The apparatus according to claim 16, wherein each partial surface comprises marks and the plug is marked.

19. The apparatus according to claim 13, wherein the module is embedded in plastic.

20. The apparatus according to claim 13, wherein the module is provided with knife or spring contacts.

21. The apparatus according to claim 13 wherein the plug is provided with knife or spring contacts.

22. The device according to claim 17, wherein the structure is made in the shape of a cube.

* * * * *